United States Patent
Xu

(10) Patent No.: US 9,842,883 B2
(45) Date of Patent: Dec. 12, 2017

(54) FLEXIBLE ARRAY SUBSTRATE STRUCTURE AND MANUFACTURING METHOD FOR THE SAME

(71) Applicant: Shenzhen China Star Optoelectronics Technology Co., Ltd., Shenzhen (CN)

(72) Inventor: Hongyuan Xu, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 102 days.

(21) Appl. No.: 15/033,650

(22) PCT Filed: Feb. 26, 2016

(86) PCT No.: PCT/CN2016/074687
§ 371 (c)(1),
(2) Date: May 2, 2016

(87) PCT Pub. No.: WO2017/128476
PCT Pub. Date: Aug. 3, 2017

(65) Prior Publication Data
US 2017/0221967 A1    Aug. 3, 2017

(30) Foreign Application Priority Data
Jan. 28, 2016 (CN) .......................... 2016 1 0058476

(51) Int. Cl.
*H01L 51/00* (2006.01)
*G02F 1/1333* (2006.01)
(Continued)

(52) U.S. Cl.
CPC .......... *H01L 27/283* (2013.01); *G02F 1/1368* (2013.01); *G02F 1/133305* (2013.01); *G02F 1/136213* (2013.01); *G02F 1/136227* (2013.01); *H01L 51/0012* (2013.01); *H01L 51/0021* (2013.01); *H01L 51/0097* (2013.01); *H01L 51/0541* (2013.01); *H01L 51/107* (2013.01); *G02F 2001/13685* (2013.01); *G02F 2001/136222* (2013.01); *G02F 2001/136236* (2013.01); *G02F 2202/02* (2013.01); *G02F 2202/10* (2013.01); *H01L 51/052* (2013.01); *H01L 51/055* (2013.01); *H01L 51/0558* (2013.01)

(58) Field of Classification Search
None
See application file for complete search history.

(56) References Cited

U.S. PATENT DOCUMENTS 6,879,359 B1 * 4/2005 Kikkawa ........... G02F 1/133553 257/57
8,013,328 B2 * 9/2011 Burroughes ........ H01L 27/3246 257/40

(Continued)

*Primary Examiner* — Michael Lebentritt
*Assistant Examiner* — Jordan Klein

(57) ABSTRACT

A flexible array substrate structure and manufacturing method thereof are disclosed, in which the patterning process of an organic semi-conductive layer is achieved by using the inside wall of the opening of a color film layer as a bank, so that one mask can be saved. Also, a process for manufacturing a device can be simplified by an improved device structure, so that the flexible array substrate structure of the invention can be obtained by only using four masks.

13 Claims, 3 Drawing Sheets

(51) Int. Cl.
*H01L 27/28* (2006.01)
*H01L 51/10* (2006.01)
*H01L 51/05* (2006.01)
*G02F 1/1368* (2006.01)
*G02F 1/1362* (2006.01)

(56) References Cited

U.S. PATENT DOCUMENTS

| | | | | |
|---|---|---|---|---|
| 8,258,004 B2* | 9/2012 | Oh | ............. | H01L 51/0545 438/151 |
| 2006/0086937 A1* | 4/2006 | Fujii | ............. | H01L 27/1292 257/72 |
| 2007/0023837 A1* | 2/2007 | Lee | ............. | H01L 51/0541 257/347 |
| 2007/0103613 A1* | 5/2007 | Song | ............. | H01L 27/124 349/43 |
| 2007/0134832 A1* | 6/2007 | Oh | ............. | B82Y 10/00 438/30 |
| 2007/0153371 A1* | 7/2007 | Cha | ............. | G02F 1/133516 359/373 |
| 2010/0051922 A1* | 3/2010 | Hotta | ............. | H01L 51/0541 257/40 |
| 2010/0123125 A1* | 5/2010 | Lee | ............. | H01L 51/0005 257/40 |
| 2011/0006290 A1* | 1/2011 | Noh | ............. | H01L 27/3262 257/40 |

* cited by examiner

FLEXIBLE ARRAY SUBSTRATE STRUCTURE AND MANUFACTURING METHOD FOR THE SAME

RELATED APPLICATIONS

This application is a National Phase of PCT Patent Application No. PCT/CN2016/074687 having International filing date of Feb. 26, 2016, which claims the benefit of priority of Chinese Patent Application No. 201610058476.X filed on Jan. 28, 2016. The contents of the above applications are all incorporated by reference as if fully set forth herein in their entirety.

FIELD AND BACKGROUND OF THE INVENTION

1. Field of the Invention

The present invention relates to a field of display technology, and more specifically to a flexible array substrate structure and manufacturing method thereof.

2. Description of the Prior Art

Flexible displays are displays which are thin like paper and curved, bended, and rolled through flexible substrates without damage. In order to materialize these flexible displays, LCD (Liquid Crystal Display), OLED (Organic Lighting Emitting Diodes), and Electric Paper Display (EPD) like flat-panel displays have been classified and developed.

Recently, there are many advantages in flexible displays such as light weight, being thin, and infrangibility by employing plastic or film materials. For this reason, these flexible displays are considered as displays for mobile devices. Also, since they have high design freedom such that shapes can be changed, these flexible displays have increased demand for household items, automotive applications, and so forth.

For the LCD, in which the active layer of an array substrate is mostly made of an inorganic material, such as amorphous silicon, polysilicon, metal oxide, and the like, a flexible display cannot be achieved. In addition, when the color film substrate and the array substrate of the LCD are bent, dislocation between the color film substrate and the array substrate is occurs, so that there are problems of light leakage, abnormal displaying, or the like on the LCD. The development of flexible LCDs is limited by these problems.

Therefore, there is a need to provide a novel flexible array substrate structure and manufacturing method thereof, so as to overcome the disadvantage in the prior art.

SUMMARY OF THE INVENTION

An object of the present invention is to provide a flexible array substrate structure and manufacturing method thereof, in which the patterning process of an organic semi-conductive layer is achieved by using the inside wall of the opening of a color film layer as a bank, so that one mask can be saved. Also, a process for manufacturing a device can be simplified by an improved device structure, so that the flexible array substrate structure of the invention can be obtained by only using four masks.

To achieve the above object, the present invention provides a flexible array substrate structure including:
a substrate including a source electrode area, a drain electrode area, a common electrode area, and a channel area between the source electrode area and the drain electrode area;
a source electrode layer disposed on the source electrode area of the substrate;
a drain electrode layer disposed on the drain electrode area of the substrate;
a common electrode layer disposed on the common electrode area of the substrate;
a color film layer covered on the source electrode layer, the drain electrode layer, and the common electrode layer, and the color film layer having a via hole and an opening exposing the channel area of the substrate; and
a first transparent conductive layer disposed on the color film layer, and the first transparent conductive layer being electrically connected to the drain electrode layer by way of the via hole,
wherein there are an organic semi-conductive layer, an organic insulative layer, a second transparent conductive layer, and a gate electrode layer in the opening, the organic semi-conductive layer is disposed on the channel area of the substrate, and contacts the source electrode layer and the drain electrode layer, the organic insulative layer is disposed on the organic semi-conductive layer, the second transparent conductive layer is disposed on the organic insulative layer, and the gate electrode layer is disposed on the second transparent conductive layer.

In one exemplary embodiment of the present invention, a protection layer is further disposed on the gate electrode layer.

In one exemplary embodiment of the present invention, the first transparent conductive layer and the common electrode layer construct a storage capacitor.

In one exemplary embodiment of the present invention, surfaces of the color film layer and the organic semi-conductive layer have hydrophobicity.

In one exemplary embodiment of the present invention, the material of the source electrode layer, the drain electrode layer, and the common electrode layer includes gold, silver, and copper.

In one exemplary embodiment of the present invention, the material of the gate electrode layer includes copper or an alloy thereof, aluminum or an alloy thereof, and molybdenum or an alloy thereof.

Furthermore, the present invention further provides a method for manufacturing a flexible array substrate structure. The method includes the following steps of:
providing a substrate, and defining a source electrode area, a drain electrode area, a common electrode area, and a channel area between the source electrode area and the drain electrode area onto the substrate;
depositing an electrode layer onto the substrate, and then patterning the electrode layer to form a source electrode layer, a drain electrode layer, and a common electrode layer on the source electrode area, the drain electrode area, and the common electrode area, respectively;
forming a color film layer onto the substrate so as to cover the source electrode layer, the drain electrode layer, and the common electrode layer;
providing a via hole and an opening exposing the channel area of the substrate onto the color film layer;
forming an organic semi-conductive layer onto the channel area of the substrate in the opening, wherein the organic semi-conductive layer contacts the source electrode layer and the drain electrode layer;
forming an organic insulative layer onto the organic semi-conductive layer;

forming a first transparent conductive layer onto the color film layer, wherein the first transparent conductive layer is electrically connected to the drain electrode layer by way of the via hole;

forming a second transparent conductive layer onto the organic insulative layer; and forming a gate electrode layer onto the second transparent conductive layer.

In one exemplary embodiment of the present invention, the method further includes the following step of: forming a protection layer onto the gate electrode layer.

In one exemplary embodiment of the present invention, the first transparent conductive layer and the common electrode layer construct a storage capacitor.

In one exemplary embodiment of the present invention, the method further includes the following step of: surface-treating the surface of the color film layer, thereby the surface of the color film layer having hydrophobicity.

In one exemplary embodiment of the present invention, the method further includes the following step of: surface-treating the surface of the organic semi-conductive layer, thereby the surface of the organic semi-conductive layer having hydrophobicity.

In one exemplary embodiment of the present invention, the organic semi-conductive layer is formed by a spin coating, a slot-die coating, or an ink-jet printing.

In one exemplary embodiment of the present invention, the material of the electrode layer includes gold, silver, and copper.

In one exemplary embodiment of the present invention, the material of the gate electrode layer includes copper or an alloy thereof, aluminum or an alloy thereof, and molybdenum or an alloy thereof.

The present invention has obvious advantages and beneficial effects over the prior art. The flexible array substrate structure and manufacturing method thereof of the present invention according to the above technical scheme has at least the following advantages and beneficial effects. The patterning process of the organic semi-conductive layer is achieved by using the inside wall of the opening as a bank, so that one mask can be saved. Also, a process for manufacturing a device can be simplified by an improved device structure, so that the flexible array substrate structure of the invention can be obtained by only using four masks.

DESCRIPTION OF SPECIFIC EMBODIMENTS OF THE INVENTION

Various preferred embodiments are now described with reference to the accompanying drawings. In the following description, for purposes of explanation, numerous specific details are set forth in order to provide a thorough understanding of a flexible array substrate structure and manufacturing method thereof, and its specific embodiment, structure, features, and functions.

Figure 1:
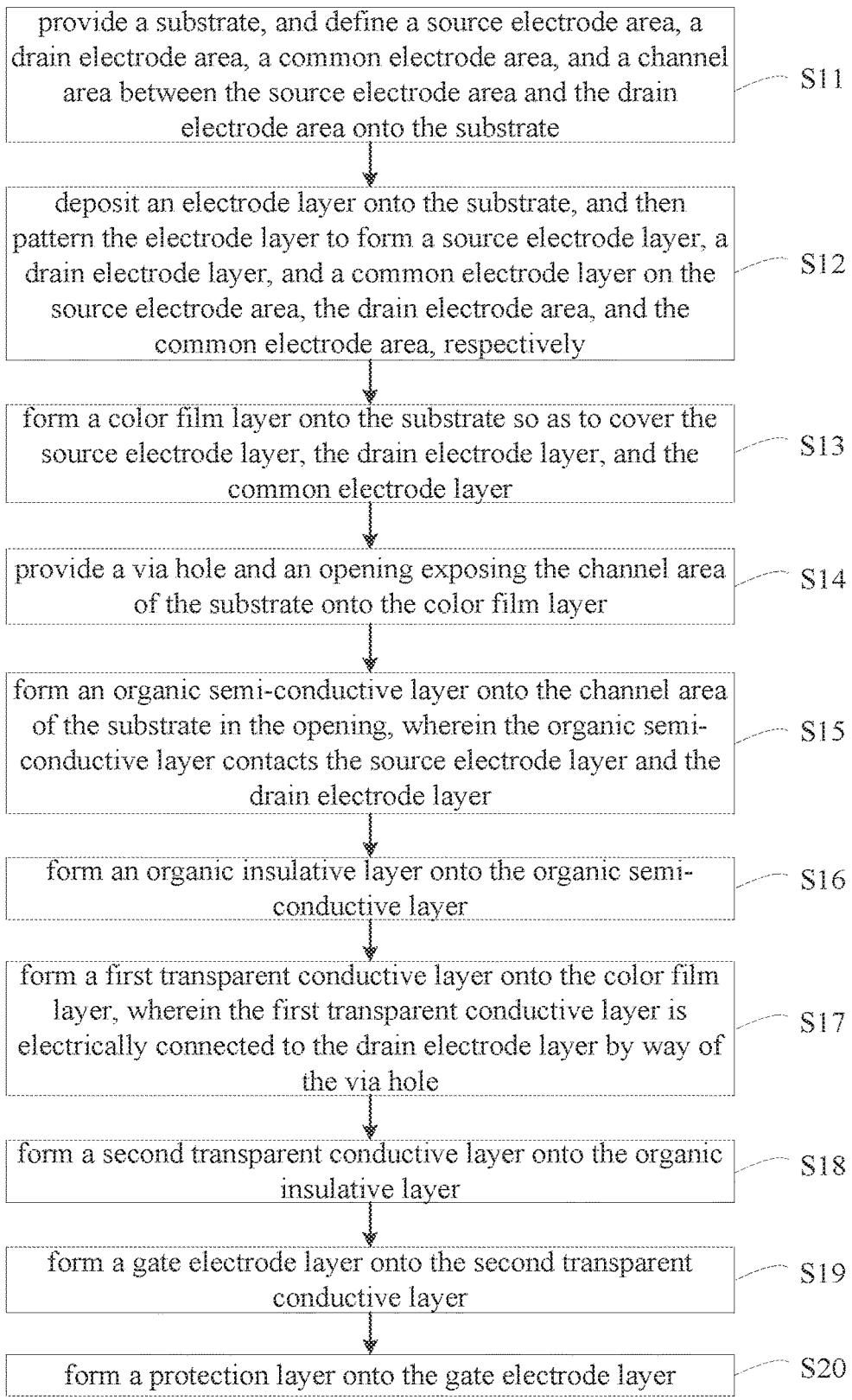
FIG. 1 is a flow chart of a method according to one embodiment of the present invention for manufacturing a flexible array substrate structure.
Figure 2A:
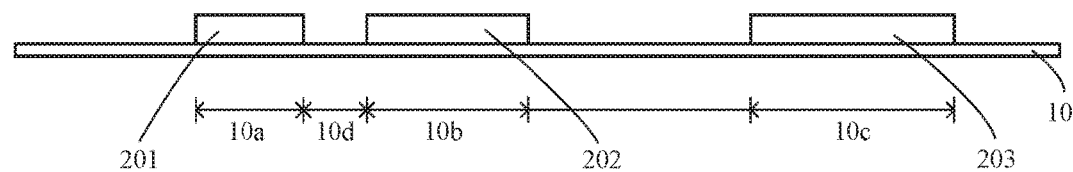
FIGS. 2a, 2b, 2c, 2d and 2e are schematic views of a method according to one embodiment of the present invention for manufacturing a flexible array substrate structure.
Figure 2B:
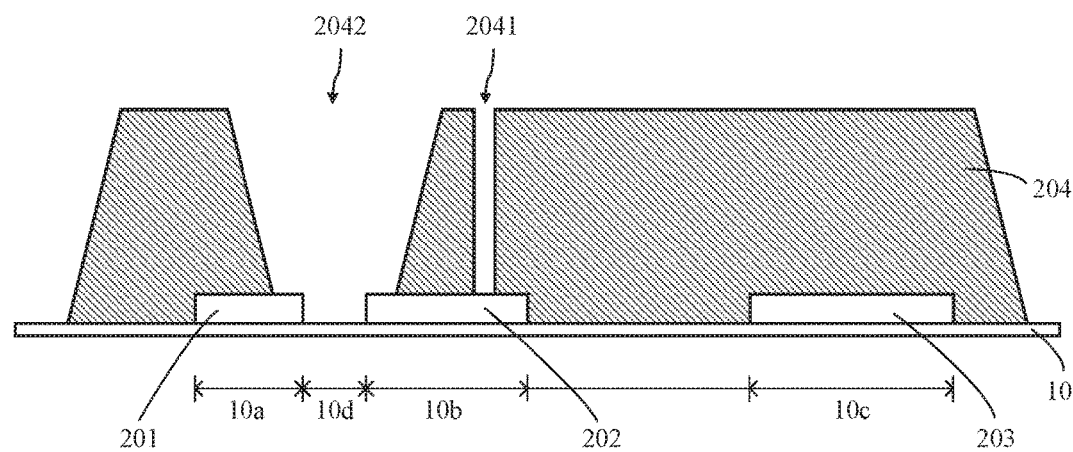
Figure 2C:
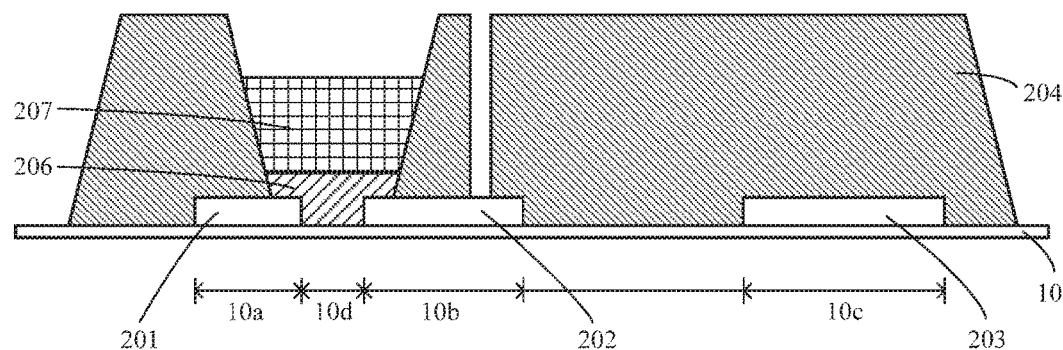
Figure 2D:
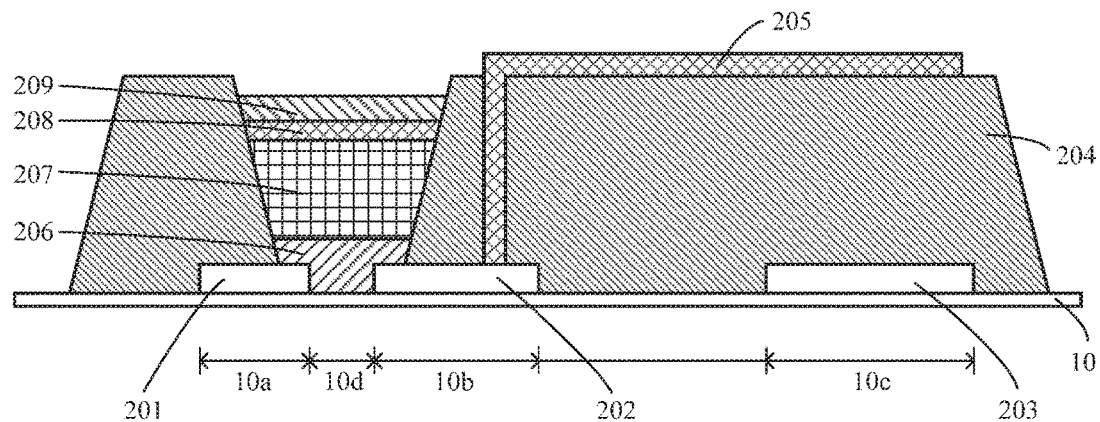
Figure 2E:
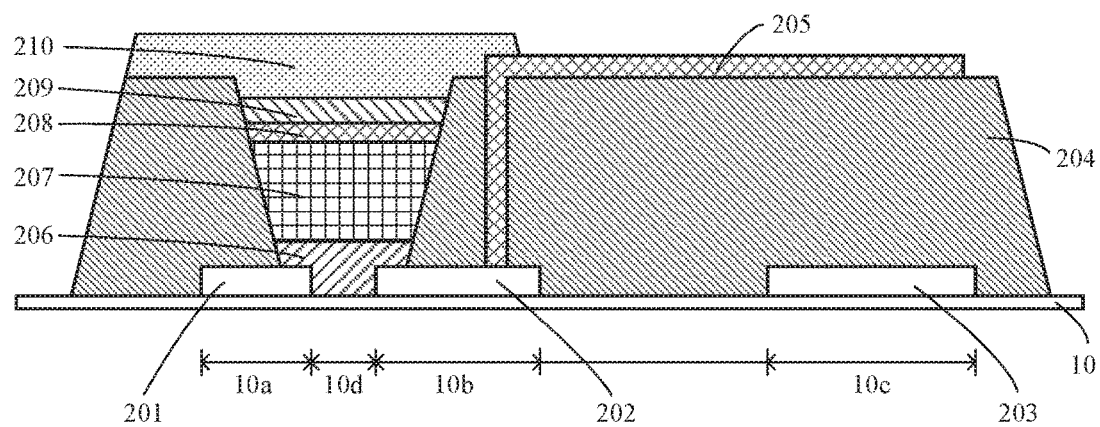

Please refer to FIG. 1 and FIGS. 2a, 2b, 2c, 2d and 2e. FIG. 1 is a flow chart of a method according to one embodiment of the present invention for manufacturing a flexible array substrate structure 1, and the method includes the following steps S11-S20. FIGS. 2a, 2b, 2c, 2d and 2e are schematic views of a method according to one embodiment of the present invention for manufacturing a flexible array substrate structure 1.

In step S11, a substrate 10 is provided, and a source electrode area 10a, a drain electrode area 10b, a common electrode area 10c, and a channel area 10d between the source electrode area 10a and the drain electrode area 10b are defined on the substrate 10. The substrate 10 is a flexible substrate.

In step S12, an electrode layer is deposited on the substrate 10, and then the electrode layer is patterned to form a source electrode layer 201, a drain electrode layer 202, and a common electrode layer 203 on the source electrode area 10a, the drain electrode area 10b, and the common electrode area 10c, respectively. The material of the electrode layer includes gold, silver, and copper, but the present invention is not limited thereto. Herewith, this step can be completed by a physical vapor deposition (PVD) and a yellow light process (first mask).

In step S13, a color film layer 204 is formed on the substrate 10 so as to cover the source electrode layer 201, the drain electrode layer 202, and the common electrode layer 203. The color film layer 204 is made of a red-color resist material, a green-color resist material, or a blue-color resist material.

In step S14, a via hole 2041 and an opening 2042 exposing the channel area 10d of the substrate 10 are provided on the color film layer 204. The patterning process of this step is completed by a second mask and a development. Herewith, the surface of the color film layer 204 can be surface-treated (e.g., $CF_4$ plasma treatment) after the opening 2042 is provided, thereby the surface of the color film layer 204 has hydrophobicity, so that the organic semi-conductive layer 206 of the following step S15 is more easily limited in the opening 2042.

In step S15, an organic semi-conductive layer 206 is formed on the channel area 10d of the substrate 10 in the opening 2042. The organic semi-conductive layer 206 contacts the source electrode layer 201 and the drain electrode layer 202. The organic semi-conductive layer 206 can be formed by a spin coating, a slot-die coating, or an ink-jet printing, but the present invention is not limited thereto. Since the inside wall of the opening 2042 can be used as a bank, the patterning process of this step can be achieved after an organic semi-conductive material for forming the organic semi-conductive layer 206 is filled in the opening 2042, so that one mask can be saved. Herewith, the surface of the organic semi-conductive layer 206 can be surface-treated (e.g., $CF_4$ plasma treatment) after the organic semi-conductive layer 206 is formed, thereby the surface of the organic semi-conductive layer 206 has hydrophobicity, so that the organic insulative layer 207 of the following step S16 is more easily limited in the opening 2042.

In step S16, an organic insulative layer 207 is formed on the organic semi-conductive layer 206.

In step S17, a first transparent conductive layer 205, which is used as a pixel electrode, is formed on the color film layer 204. The first transparent conductive layer 205 is electrically connected to the drain electrode layer 202 by way of the via hole 2041. The first transparent conductive layer 205 can be made of indium tin oxide, but the present invention is not limited thereto. The first transparent conductive layer 205 and the common electrode layer 203 construct a storage capacitor.

In step S18, a second transparent conductive layer 208 is formed on the organic insulative layer 207. The second transparent conductive layer 208 can be made of indium tin oxide, but the present invention is not limited thereto.

In step S19, a gate electrode layer 209 is formed on the second transparent conductive layer 208. The material of the gate electrode layer 209 includes copper or an alloy thereof, aluminum or an alloy thereof, and molybdenum or an alloy thereof, but the present invention is not limited thereto. After steps S17-S19, the organic insulative layer 207 has both the second transparent conductive layer 208 and the gate electrode layer 209 thereon by using a half-tone mask (third mask), as well as the first transparent conductive layer 205 is formed.

In step S20, a protection layer 210 is formed on the gate electrode layer 209 to prevent moisture and pollution of solution. The patterning process of this step is completed by a fourth mask and a development.

For above descriptions, the patterning process of each of these layers is achieved by existing processes such as exposing, developing, etching, and the like.

The flexible array substrate structure 1 of the invention can be manufactured by executing above steps S11-S20.

As mentioned above, in the flexible array substrate structure and manufacturing method thereof of the present invention, the patterning process of the organic semi-conductive layer 206 is achieved by using the inside wall of the opening 2042 as a bank, so that one mask can be saved. Also, a process for manufacturing a device can be simplified by an improved device structure, so that the flexible array substrate structure 1 of the invention can be obtained by only using four masks.

The above description of the invention is intended to be illustrative and not limiting. Various changes or modifications in the embodiments described may occur to those skilled in the art. These can be achieved without departing from the spirit or scope of the invention.

What is claimed is:

1. A flexible array substrate structure, comprising:
   a substrate comprising a source electrode area, a drain electrode area, a common electrode area, and a channel area between the source electrode area and the drain electrode area;
   a source electrode layer disposed on the source electrode area of the substrate;
   a drain electrode layer disposed on the drain electrode area of the substrate;
   a common electrode layer disposed on the common electrode area of the substrate;
   a color film layer covered on the source electrode layer, the drain electrode layer, and the common electrode layer, and the color film layer having a via hole and an opening exposing the channel area of the substrate; and
   a first transparent conductive layer disposed on the color film layer, and the first transparent conductive layer being electrically connected to the drain electrode layer by way of the via hole,
   wherein there are an organic semi-conductive layer, an organic insulative layer, a second transparent conductive layer, and a gate electrode layer in the opening, the organic semi-conductive layer is disposed on the channel area of the substrate, and contacts the source electrode layer and the drain electrode layer, the organic insulative layer is disposed on the organic semi-conductive layer, the second transparent conductive layer is disposed on the organic insulative layer, the gate electrode layer is disposed on the second transparent conductive layer, and surfaces of the color film layer and the organic semi-conductive layer have hydrophobicity.

2. The flexible array substrate structure of claim 1, wherein a protection layer is further disposed on the gate electrode layer.

3. The flexible array substrate structure of claim 1, wherein the first transparent conductive layer and the common electrode layer construct a storage capacitor.

4. A flexible array substrate structure, comprising:
   a substrate comprising a source electrode area, a drain electrode area, a common electrode area, and a channel area between the source electrode area and the drain electrode area;
   a source electrode layer disposed on the source electrode area of the substrate;
   a drain electrode layer disposed on the drain electrode area of the substrate;
   a common electrode layer disposed on the common electrode area of the substrate;
   a color film layer covered on the source electrode layer, the drain electrode layer, and the common electrode layer, and the color film layer having a via hole and an opening exposing the channel area of the substrate; and
   a first transparent conductive layer disposed on the color film layer, and the first transparent conductive layer being electrically connected to the drain electrode layer by way of the via hole,
   wherein there are an organic semi-conductive layer, an organic insulative layer, a second transparent conductive layer, and a gate electrode layer in the opening, the organic semi-conductive layer is disposed on the channel area of the substrate, and contacts the source electrode layer and the drain electrode layer, the organic insulative layer is disposed on the organic semi-conductive layer, the second transparent conductive layer is disposed on the organic insulative layer, and the gate electrode layer is disposed on the second transparent conductive layer.

5. The flexible array substrate structure of claim 4, wherein a protection layer is further disposed on the gate electrode layer.

6. The flexible array substrate structure of claim 4, wherein the first transparent conductive layer and the common electrode layer construct a storage capacitor.

7. The flexible array substrate structure of claim 4, wherein surfaces of the color film layer and the organic semi-conductive layer have hydrophobicity.

8. A method for manufacturing a flexible array substrate structure, comprising the following steps of:
   providing a substrate, and defining a source electrode area, a drain electrode area, a common electrode area, and a channel area between the source electrode area and the drain electrode area onto the substrate;
   depositing an electrode layer onto the substrate, and then patterning the electrode layer to form a source electrode layer, a drain electrode layer, and a common electrode layer on the source electrode area, the drain electrode area, and the common electrode area, respectively;
   forming a color film layer onto the substrate so as to cover the source electrode layer, the drain electrode layer, and the common electrode layer;
   providing a via hole and an opening exposing the channel area of the substrate onto the color film layer;
   forming an organic semi-conductive layer onto the channel area of the substrate in the opening, wherein the organic semi-conductive layer contacts the source electrode layer and the drain electrode layer;

forming an organic insulative layer onto the organic semi-conductive layer;

forming a first transparent conductive layer onto the color film layer, wherein the first transparent conductive layer is electrically connected to the drain electrode layer by way of the via hole;

forming a second transparent conductive layer onto the organic insulative layer; and forming a gate electrode layer onto the second transparent conductive layer.

9. The method for manufacturing the flexible array substrate structure of claim 8, wherein the method further comprises the following step of: forming a protection layer onto the gate electrode layer.

10. The method for manufacturing the flexible array substrate structure of claim 8, wherein the first transparent conductive layer and the common electrode layer construct a storage capacitor.

11. The method for manufacturing the flexible array substrate structure of claim 8, wherein the method further comprises the following step of: surface-treating a surface of the color film layer, thereby the surface of the color film layer having hydrophobicity.

12. The method for manufacturing the flexible array substrate structure of claim 8, wherein the method further comprises the following step of: surface-treating a surface of the organic semi-conductive layer, thereby the surface of the organic semi-conductive layer having hydrophobicity.

13. The method for manufacturing the flexible array substrate structure of claim 8, wherein the organic semi-conductive layer is formed by a spin coating, a slot-die coating, or an ink-jet printing.

* * * * *